United States Patent [19]
Lee

[11] Patent Number: 5,177,436
[45] Date of Patent: Jan. 5, 1993

[54] CONTACTOR FOR TESTING INTEGRATED CIRCUIT CHIPS MOUNTED IN MOLDED CARRIER RINGS

[75] Inventor: Kenneth R. Lee, Lincoln, Mass.

[73] Assignee: Aseco Corporation, Marlboro, Mass.

[21] Appl. No.: 703,604

[22] Filed: May 21, 1991

[51] Int. Cl.⁵ .......................... G01R 1/02; G01R 1/04
[52] U.S. Cl. ............................. 324/158 F; 324/72.5; 324/158 P
[58] Field of Search ............... 329/158 P, 158 F, 72.5; 439/73, 74, 824, 55, 68, 70, 71

[56] References Cited

U.S. PATENT DOCUMENTS

| | | | |
|---|---|---|---|
| 3,858,959 | 1/1975 | Arnold | 439/263 |
| 4,498,047 | 2/1985 | Hexomer et al. | 324/158 F |
| 4,675,599 | 6/1987 | Jensen et al. | 324/158 F |
| 4,739,257 | 4/1988 | Jenson et al. | 324/158 F |
| 4,747,784 | 5/1988 | Cedrone | 324/158 F |
| 4,866,374 | 9/1989 | Cedrone | 324/158 F |
| 4,887,969 | 12/1989 | Abe | 439/73 |
| 4,970,460 | 11/1990 | Jensen et al. | 324/158 P |
| 4,986,760 | 1/1991 | Petersen et al. | 439/73 |

Primary Examiner—Ernest F. Karlsen
Assistant Examiner—William J. Burns
Attorney, Agent, or Firm—Cesari and McKenna

[57] ABSTRACT

A contactor including a test fixture for receiving an integrated circuit chip mounted in a carrier package and for providing contacts with electrical conductor pads of the package to facilitate electrical testing thereof is provided. The test fixture comprises a plurality of contact members mounted to a spring-loaded plunger. Each contact member includes a strip of conductive fingers with protruding contacts for springing engagement with the conductor pads of the carrier when the plunger is depressed. The test fixture resides in a cavity of a housing unit and is aligned with a central aperture therein. In operation, a ram holding the carrier lowers it through the central aperture of the housing unit and onto the plunger. The carrier is then pressed against the plunger, causing it to depress. This allows the carrier conductor pads to frictionally engage the protruding contacts of the conductive fingers, thus effectuating electrical contact.

24 Claims, 4 Drawing Sheets

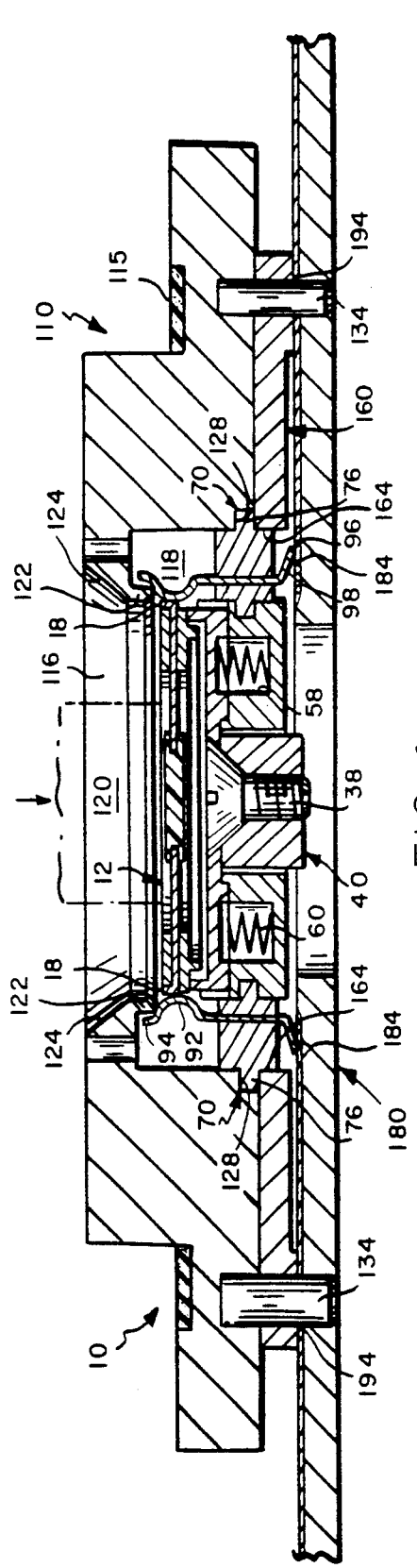
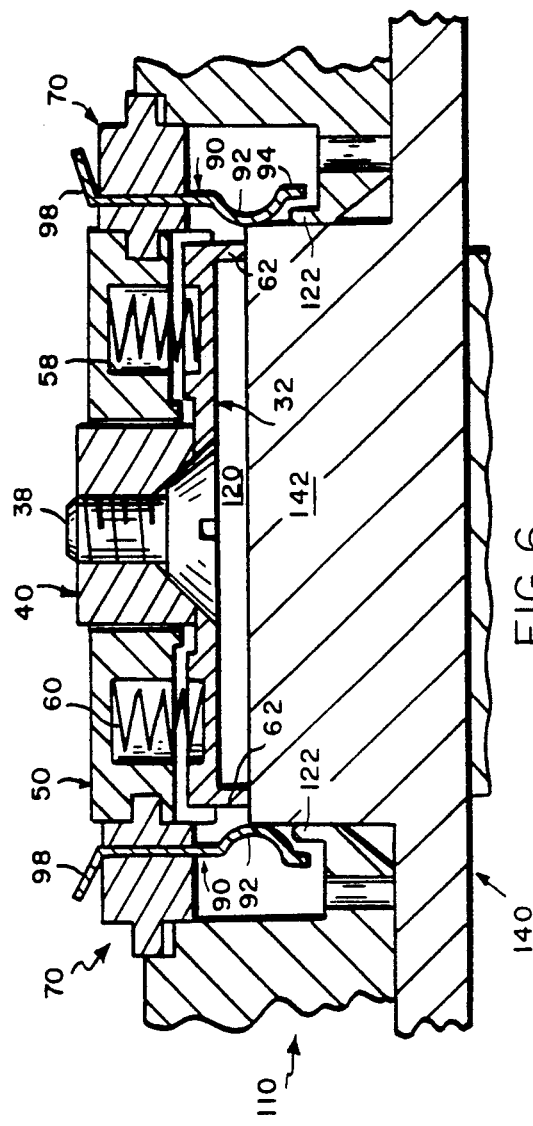
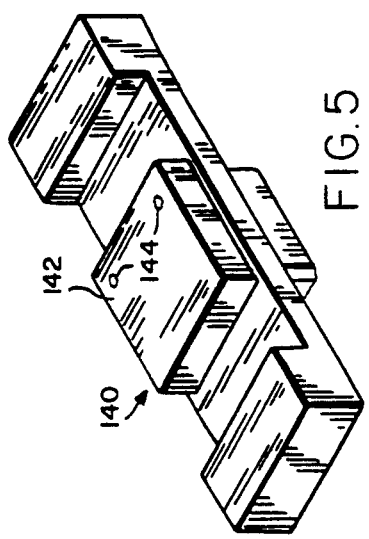

CONTACTOR FOR TESTING INTEGRATED CIRCUIT CHIPS MOUNTED IN MOLDED CARRIER RINGS

FIELD OF THE INVENTION

This invention relates generally to the electrical testing of integrated circuit chips and, more specifically, to a contactor for facilitating access to the conductor pads of a molded carrier ring package during such testing.

BACKGROUND OF THE INVENTION

The packaging of integrated circuit chips is important to the design and manufacture of electronic systems for a variety of reasons. A chip is generally too small and delicate to handle without suitable protection during the manufacture of equipment incorporating the chip. Accordingly, a carrier package is often used to protect the chip against mechanical damage during such operations as electrical testing, "burn in", marking, shipping and the like, as well as to protect against damage arising from static charges or leakage currents. The carrier package also facilitates the mounting of the chips on circuit boards.

A molded carrier ring (MCR) package is a particularly useful package for chips with a large pin count and thus fine pitch (i.e., a spacing on the order of 0.8 mm or less between adjacent leads on the chip). Unlike the leads on other carrier packages which typically are accessible from the top or bottom of the package, the leads on the MCR package are accessed from the side through conductor pads which are "low-set", i.e., they do not protrude appreciably from the frame.

A test contactor is a device that establishes electrical connections between the conductors of a chip carrier package and test circuitry for performing tests of the chip. During testing, it is usually necessary for the contactor to make simultaneous contact with all of the chip carrier conductors for complete circuit checking. However, because of the small size of the MCR conductor pads and the close spacing of those pads, contact strips in the contactor must be precisely applied to the pads to ensure accurate testing of the chip.

SUMMARY OF THE INVENTION

Briefly, a contactor constructed in accordance with the invention includes a test fixture comprising a plurality of contact members mounted to a spring-loaded plunger assembly having a fixed base and a movable head. Specifically, a tongue of each member is disposed in a groove extending around the perimeter of the plunger base. Each contact member includes a pair of notches in one end thereof and a pair of detent projections in the other end. The notches are dimensioned and arranged for mating with the detent projections of adjacent members when they are interlocked to form the fixture.

Each member also carries a strip of conductive fingers arranged along its longitudinal axis and extending perpendicularly to that axis in both directions in cantilever fashion. The upper portions of the fingers have protruding contacts facing an inlet defined by the test fixture. These protruding contacts provide spring-loaded engagement with the conductor pads of a chip carrier package when the plunger head is depressed. The lower portions of the fingers contact a circuit board (the "device under test" or "DUT" board) which is typically located on the main body of the electrical test equipment and which contains leads for carrying electrical signals to and from the chip under test.

The test fixture resides in a cavity of a housing unit and is aligned with a central aperture therein. The upper portions of the fingers are positioned around the periphery of the aperture for edge contact with the conductor pads of a chip carrier to be inserted therein; the lower, sloped contact portions of the fingers compressively and frictionally engage conductive portions on the circuit board, thus completing electrical paths from the carrier package pads to the circuit board. The conductive portions ""fan out" to test points along the perimeter of the circuit board that are accessible to probes of a test apparatus.

The fingers are held in the test fixture in such fashion that, in the absence of a chip under test, they press against a lip of the fixture so that they are initially "loaded" (i.e., subjected to a cantilever force) by a small amount. When a chip to be tested is loaded into the fixture, the conductor pads on the sides of the chip carrier ring further depress the fingers. The initial loading increases the force applied to the chip above what it would have been without the loading, thereby increasing the quality of the contact between the fingers and the carrier ring pads. It also enhances the life of the fingers.

In operation, a ram holding the chip carrier lowers it into the central aperture of the housing and onto the plunger head. Further inward movement of the ram depresses the plunger head and brings the carrier conductor pads into engagement with the protruding contacts of the conductive fingers, thus placing the chip in position for electrical testing by the test apparatus.

An advantage of this invention is that the contactor provides edge contact with carrier packages having conductor pads situated about their peripheries. More specifically, the test fixture includes contact fingers that provide simultaneous edge contact with the low-set conductor pads positioned in spaced parallel relation around the periphery of the carrier package. The contact fingers are assembled to the fixture such that no manual registration is required to align the conductor pads with the contacts. Moreover, the contact members of the fixture mount to the plunger in a fast and efficient manner, thereby facilitating installation and replacement.

Further, the contactor provides a short and direct path to the contacts of the DUT board. Typically, such boards have had additional connectors which mate with corresponding connectors on the test fixture. The present invention eliminates such intermediate connectors and provides a single-lead, short path directly between the pads of the carrier ring and the conductors of the DUT board. This minimizes the impedance mismatch caused by the contactor and enhances measurement accuracy, particularly in circuits which are to be tested at very high frequencies, such as up to 50 MHz. In the present invention, this path length has been reduced to on the order of one-half inch.

BRIEF DESCRIPTION OF THE DRAWINGS

The above and further advantages of the invention may be better understood by referring to the following description in conjunction with the accompanying drawings, in which:

FIG. 2A is a partial side view of the arrangement of notches of a contact member in accordance with the invention;

FIG. 2B shows a contact member mounted to the base of a plunger assembly in accordance with the invention;

FIG. 2C is a vertical section view through a contact member showing the contour of a conductive finger in accordance with the invention;

FIG. 4 is a cross-sectional view of an assembled contactor including a chip carrier advanced into a test postion;

FIG. 5 is an isometric view of a guiding jig used to install the test fixture of FIG. 2 into the contactor; and FIG. 6 is an enlarged cross-sectional view of the guiding jig used during the installation of the test fixture.

DETAILED DESCRIPTION OF ILLUSTRATIVE EMBODIMENTS

Figure 1:
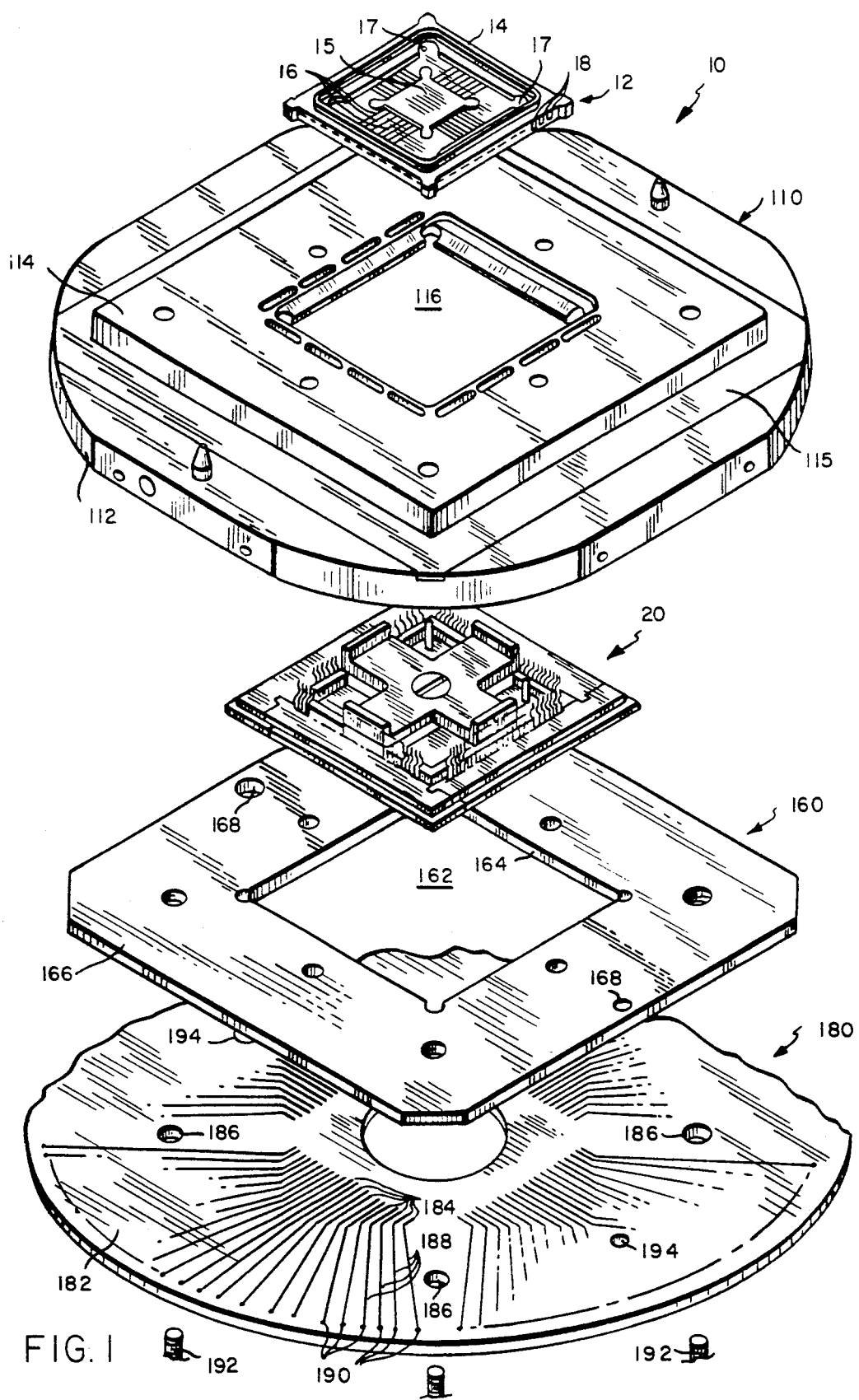
FIG. 1 is an exploded isometric view of the components of a contactor in accordance with the invention.

As shown in FIG. 1, a contactor, shown generally at 10, is arranged for testing an integrated circuit (IC) chip 15 mounted in a chip carrier package 12, such as the illustrated molded carrier ring. The depicted carrier package 12 has a generally square peripheral leadframe 14 into which extend input/output leads 16 of the IC chip 15. These leads 16 terminate at conductor pads 18 positioned around the perimeter of the carrier package 12. The conductor pads 18 are generally "low-set", i.e. they do not protrude appreciably from the frame 14; accordingly, perpendicular, inward edge contact is required to effectuate electrical connections with them.

The contactor 10 in accordance with the invention comprises a test fixture 20 enclosed within a housing unit 110 and secured therein by a retainer plate 160. The test fixture 20 establishes perpendicular contact simultaneously with all the conductor pads 18 of the carrier package 12.

The contactor carries electrical signals between an IC chip mounted in the contactor for testing and a circuit tester which supplies test signals to, and receives them from, the IC chip and evaluates the results. Such circuit testers typically provide a "DUT" or "performance" board which serves as an interface between the contactor and the tester. Such a board is shown as element 180 in FIG. 1.

Figure 2:
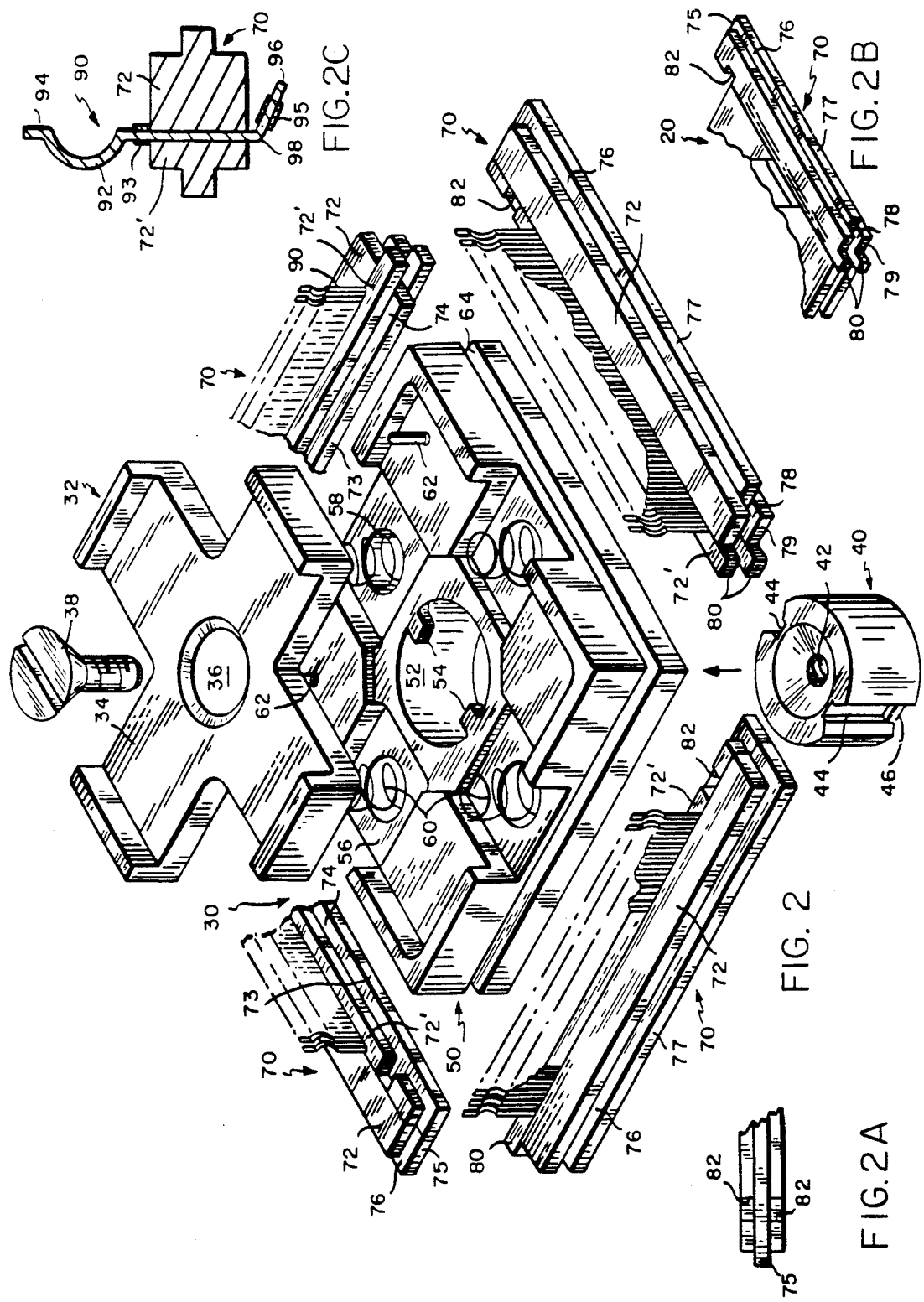
FIG. 2 is an exploded isometric view of a test fixture of the contactor of FIG. 1.

As shown in exploded relation in FIG. 2, the test fixture 20 comprises a spring-loaded plunger assembly 30 configured to receive the IC chip carrier package 12 and advance the package into a test position. To that end, the plunger assembly 30 includes a fixed base 50 and a movable head 32 linked by a reciprocating piston 40. The head 32 has a plurality of arms 34 arranged in a cross-like configuration with an opening 36 in the middle thereof. A central cylindrical aperture 52 extending through the base 50 accommodates the piston 40. The piston 40 is inserted from the bottom in the direction of the arrow and the head 32 is then attached to the piston 40 by a fastening screw 38 passed through the opening 36.

The aperture 52 in the base 50 includes inwardly projecting tabs 54 that coact with slots 44 extending lengthwise along the piston 40. Each slot 44 opens at the top of the piston and terminates at a motion stop 46 positioned near the bottom. The stops 46 together with the attached head 32 combine to retain the piston 40 within the aperture 52.

Cross-like recesses 56 in the base 50 of the plunger assembly 30 are dimensioned for seating engagement with the arms 34 of the head 32 when the plunger is depressed. A circular recess (not shown) under each arm 34 is aligned with a respective circular recess 58 in the base 50 to accommodate a spring 60. Collectively, the springs 60 position the head 32 in an upwardly biased position. As will be described further herein, the head 32 is depressed by a conventional ram (not shown) when an IC chip carrier package 12 is advanced into a test position. An example of a ram used in conjunction with the contactor 10 is shown and described in U.S. Pat. No. 4,686,468, titled CONTACT SET FOR TEST APPARATUS FOR TESTING INTEGRATED CIRCUIT PACKAGE, issued to Lee et al. on Aug. 11, 1987, which patent is expressly incorporated by reference as though fully set forth herein. Accordingly, each arm 34 of the head 32 terminates upwardly to provide a means for receiving the carrier package 12 from the ram and holding it during testing. A pair of guiding pins 62 project upwardly from the base 50 and engage locating holes 17 (see FIG. 1) in the carrier package 12 to correctly align the carrier as it is lowered onto the plunger 30.

With further reference to FIG. 2, the test fixture 20 also comprises a plurality of identical contact members 70 mounted to the base 50 of plunger assembly 30 and carrying electrical contacts that engage the pads 18 (FIG. 1) of the carrier package 12. Each contact member 70 is composed of two individual segments 72 and 72' joined together by an adhesive material; alternatively, the contact member may be molded around the contacts. Each member also includes a lengthwise strip of transversely extending conductive fingers 90.

Specifically, each interlocking member 70 includes a tongue 74 formed along an inner longitudinal edge 73 and continuing as a ridge 76 around an end 75 and along an outer longitudinal edge 77. The tongue 74 and outer ridge 76 terminate inwardly of the opposite end 79 of the member, thereby forming a channel 78 along that end. A pair of spaced detent projections 80 protrude from the end 79, while a pair of notches 82 (see FIG. 2A) aligned above and below the tongue 74 are positioned near the end 75. The detent projections 80 mate with the notches 82 of an adjacent member 70 when they are interlocked around the plunger 30 in the following manner.

The tongue 74 of a member 70 is frictionall engaged with a groove 64 in the perimeter of the plunger base 50, with the inner edges of the notches 82 flush with a corner of the base 50 (see FIG. 2B); the detent projections 80 then extend beyond another corner of the base 50. The tongue 74 of another contact member 70 is then inserted into the groove 64 on an adjacent side of the base and positioned with its detent projections 80 disposed in the notches 82 of the previously inserted member. The remaining members 70 are mounted in similar fashion to provide an assembled test fixture 20 as depicted in FIG. 1. Here, it should be noted that the portion of the inner tongue 74 extending between the notches 82 and the end 75 of each member 70 is dimensioned and arranged to engage the channel 78 along the end 79 of an adjacent member in an interlocking "tongue and groove" arrangement.

As noted above, each contact member 70 also includes a strip of conductive contact fingers 90. Such fingers are readily formed in accordance with conventional practice, that is, a finger strip is typically formed from a single sheet of conductive material, e.g. berylium copper, that is etched to a desired strip pattern. During the etching process, the etching pattern leaves an outer contact frame (not shown) consisting of the sheet material to support the fingers. Upper and lower sections of the fingers are then laminated with an insulating material, e.g. Kapton, that stabilizes them in spaced parallel relation. Thereafter, the fingers are formed to a specific contour, the frame is removed and the fingers are gold-plated.

As depicted in FIG. 2C, the fingers 90 are sandwiched between the segments 72 and 72' of the member 70 along the midsections of the fingers. The fingers 90 have cantilever spring sections 94 and 98 extending upwardly and downwardly from the members 70. Specifically, the upper portion 94 of each finger 90 includes a protruding contact 92 and the lower portion 98 includes a sloped contact 96. Kapton strips 93, 95 maintain the finger spacing.

The test fixture 20 provides a number of features and advantages. First, the fixture 20 is configured to provide contact with a chip carrier package 12 having conductor pads 18 positioned in spaced parallel relation around the perimeter of the package 12. That is, the contact fingers 90 are positioned within a member such that they are centered about a side of the plunger assembly 30 when the member 70 is mounted thereto. The fingers 90 are then affixed to the contact members 70 and assembled to the fixture. In the entire assembly process, no manual alignment is required because of the manner in which the various parts fit with each other. Moreover, the contact members 70 mount to the plunger assembly 30 in a fast and efficient manner, thereby facilitating cost-effective installation and replacement.

Figure 3:
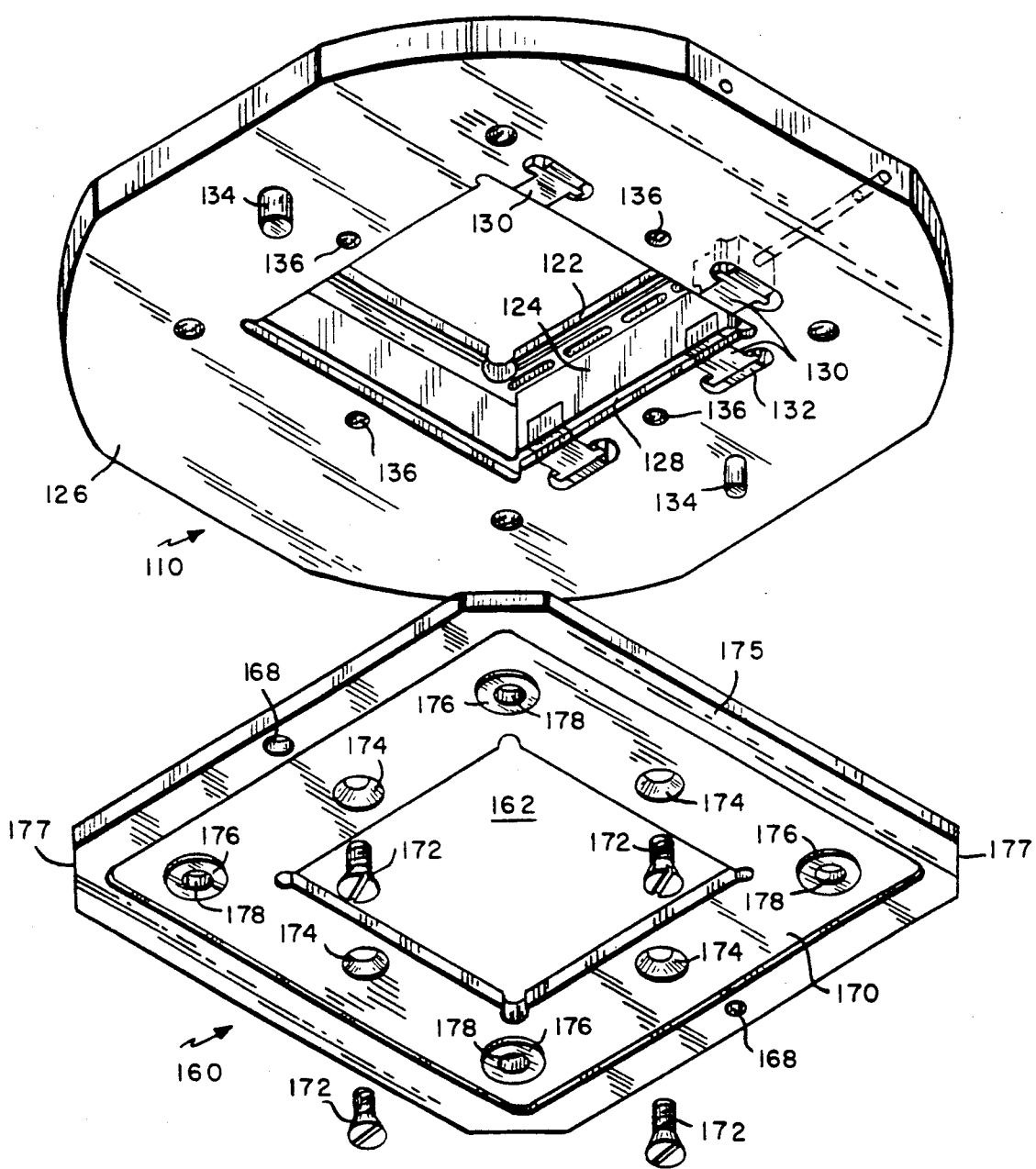
FIG. 3 is an exploded isometric bottom view of a housing unit and a retainer plate of the contactor of FIG. 1.

Refer now to FIGS. 1, 3 and 4. The contactor 10 also comprises a housing unit 110 that encompasses the test fixture 20. The housing unit 110 has a generally square body 112 with an integrally formed, upwardly projecting platform 114. The platform 114 includes a central aperture 116 that opens into a cavity 118 of an assembled contactor 10. The test fixture 20 resides in the cavity 118 and together with the aperture 116 it provides an inlet 120 for receiving the carrier packages 12. Slanted sidewalls 124 around the aperture 116 serve to guide the carrier packages 12 into the inlet 120.

As shown in FIG. 4, lips 122 extend downwardly from the sidewalls 124. The contact fingers 90 are spring-biased inwardly by the lips 122 to create a small initial "load" or pretension. This positions the protruding contacts 92 to allow insertion of the carrier package 12 while increasing the contact force between the fingers and the conductor pads 18 on the periphery of the package 12. Referring also to FIG. 3, the bottom surface 126 of the housing unit 110 is generally planar and includes a recessed rim 128 around the base of the sidewalls 124 leading into the cavity 118. Vises 130 arranged in slots 132 adjacent to the rim 128, secure the test fixture 20 within the housing unit 110 when the fixture is installed therein.

The test fixture 20 is installed in the housing unit 110 with the use of a guiding jig 140, as depicted in FIGS. 5 and 6. The jig 140 is a generally rectangular member with a generally square raised step 142 located in the middle thereof. The step 142 includes locating holes 144 dimensioned to receive the test fixture's guiding pins 62. To install the fixture 20, the raised step 142 is positioned through the central aperture 116 (see FIG. 1) of the housing unit 110. The unit 110 is turned over and the inlet 120 of the test fixture 20 is placed over the jig 140. The fixture 20 is urged onto the step 142 such that the guiding pins 62 engage the locating holes 144. As shown in FIG. 6, the step 142 engages the protruding contact portions 92 of the fingers 90, thereby forcing the fingers outwardly so that the tip of the upper portions 94 are outward of the lips 122. Further inward movement brings the fixture 20 and the fingers 90 into the position shown in FIG. 6. The jig 140 is then withdrawn, releasing the fingers 90 and thereby bringing the tip of the upper portions 94 into engagement with the lip 122. At this point as shown in FIG. 4, the ridges 76 of the contact members 70 are seated against the rim 128.

Referring again to FIGS. 1, 3 and 4, a retainer plate 160 restricts the movement of the test fixture 20 within the housing unit 110. The plate has an opening 162 whose periphery 164 overlaps the outer ridges 76 of the contact members 70 as shown in FIG. 4. The thickness of the plate 160 also provides spacing to offset the height of the lower sloped portions 98 of the contact fingers 90 extending from the members. As shown in FIGS. 1 and 3, a generally planar, top surface 166 of the plate 160 mounts adjacent to the bottom surface 126 of the housing unit 110 in superimposed relation by aligning and then engaging a pair of keyed apertures 168 to a pair of keyed studs 134 that project downwardly from the unit 110. Mounting screws 172 projecting upwardly through recessed apertures 174 in the retainer plate 160 and into threaded holes 136 in the housing unit 110 secure the plate to the contactor 10. In particular, the bottom surface 170 of the plate 160 has a boss 176 associated with a through-hole 178 located in each chamfered corner 177. The bosses 176 are coplanar with a crest 175 around the outer perimeter of the plate to offset the height of the inserted mounting screws 172. By securing the retainer plate 160 to the housing unit 110, the modified assembly can be adapted to a variety of DUT boards.

With further reference to FIGS. 1 and 4, the contactor of the present invention is shown mounted to a typical DUT board 180 which forms part of a test apparatus (not shown). The connection is made by way of the retainer plate 160 by mounting screws 192 extending upwardly through apertures 186 in the board 180 and into the housing unit 110. The top surface of board 182 has rows of conductive portions 184 configured and arranged to engage the sloped contacts 96 of the test fixture fingers 90. To provide registration of the contacts 96 with the conductive portions 184, the board 180 is provided with keyed apertures 194 that mate with studs 134 of the housing unit 110. The retainer plate 160 is mounted on board 180 such that the sloped contacts 96 are forced slightly upward, thereby providing a spring-loaded engagement with the conductive portions 184. As shown in FIG. 1, conductive traces 188 on the board 180 extend radially, i.e. "fan out", from the conductive portions 184 to plated vias 190 located around the perimeter of the board. The vias 190 are coupled to test points (not shown) on the bottom surface of the board 180 to provide external access to the conductor pads 18 of the carrier package 12.

In operation, a ram (not shown) holding the carrier package 12 lowers it through the central aperture 116 of the housing unit 110 and onto the plunger 30 of the test fixture 20. If the package 12 is not oriented for correct seating engagement with the head 32 of the plunger 30, the sidewalls 124 force the carrier package 12 into the correct orientation. The ram then presses the carrier package 12 against the plunger assembly 30, causing the head 32 to depress and advancing the carrier to the test position. As the head 32 of the plunger 30 depresses, the carrier conductor pads 18 wipe the protruding contacts 92 of the conductive fingers 90, forcing them to retract slightly in an outwardly transverse direction. Once the head is fully depressed, the resiliency of the contacts 92 in the opposite direction provides compressive engagement with the pads 18.

The IC chip 15 is now in position for electrical testing by the test apparatus. In some applications, the chip 15 is tested under various temperatures in an environmental chamber (not shown). Accordingly, a sealing gasket 115, shown in FIG. 1 around the base of the platform 114 of the housing unit 110, allows the contactor 10 to plug into a chamber and maintain proper temperatures during cycle testing. After testing is completed, the ram retracts back through the aperture 116 as the head 32 of the plunger 30 "springs" back to its unbiased position. This relieves the forces applied to the conductor pads 18 of the carrier package 12 and enables the ram to remove the carrier 12 from the contactor 10.

Although a preferred embodiment of the invention has been described, it is to be understood that other configurations may be used, depending upon the application, without deviating from the inventive concepts set forth herein. For example, the vertical positioning of a strip of conductive fingers within a contact member may result in the lower portions of the fingers having relatively short lengths, thus allowing attachment and engagement to a contact board without the need of a spacing function. Additionally, the use of a retainer plate secured to the housing unit independently of the contact board allows the contactor to be adapted to various testing apparatus and equipment. Such an embodiment is intended by the inventors and, as such, is an important contribution to the contactor art.

It will therefore be apparent to those skilled in the art that various changes and modifications in the specifically described embodiments can be carried out without departing from the scope of the invention which is to be limited only by the scope of the appended claims.

What is claimed is:

1. A test fixture configured for installation within a contactor used to facilitate the connection of conductor pads of an integrated circuit chip carrier package to test apparatus, said test fixture comprising:
    a plunger assembly including a moveable head and a stationary base linked by a reciprocating piston for receiving the carrier package and advancing the carrier package into a test position when said moveable head is depressed, said base having a groove in the perimeter thereof; and
    a plurality of contact members mounted to said plunger base and providing contact with the conductor pads of the carrier package, each of said contact members comprising:
        a non-conducting tongue dimensioned for engaging said groove of said base; and
        a plurality of contact fingers configured for electrical engagement with the conductor pads of the carrier, each of said contact fingers including an upper portion having a protruding contact facing an inlet defined by said test fixture and a lower contact portion,
    whereby said protruding contacts of said fingers electrically engage the conductor pads of the chip carrier package when the carrier package is advanced into the test position in said inlet, and said lower contact portions of said fingers make direct electrical contact with the conductive circuit traces of a test board connected to the test apparatus so that the pads of the package may be accessed by the test apparatus.

2. A test fixture according to claim 1 in which said fingers each have an upper rounded portion for wiping contact with said conductor pads and a lower straight section for pressing against said circuit traces.

3. A test fixture according to claim 2 in which said contact members are mounted in said fixture such as to pretension the upper portions thereof.

4. A test fixture according to claim 2 in which said fingers are on the order of no more than about one-half inch in length so as to limit the path length between the conductor pads and the test board traces to thereby minimize impedance discontinuities in testing high frequency circuit chips.

5. A test fixture configured for installation within a contactor used to facilitate the connection of electrical conductor pads of an integrated circuit chip carrier package to test apparatus, said test fixture comprising:
    a spring-loaded plunger assembly for receiving the carrier package and advancing the carrier package into a test position when said plunger is depressed, said plunger including a moveable head and a stationary base linked by a reciprocating piston, said base having a groove in the perimeter thereof; and
    a plurality of contact members mounted to said plunger base and providing contact with the electrical conductor pads of the carrier package, each of said contact members comprising:
        a tongue dimensioned for engaging said groove of said base;
        a pair of detent projections and a pair of notches, said detent projections dimensioned and arranged for mating with notches of adjacent ones of said contact members; and
        a plurality of contact fingers configured for electrical engagement with the conductor pads of the carrier, each of said contact fingers including an upper portion having a protruding contact facing an inlet defined by said test fixture and a lower contact portion,
    whereby the conductor pads of the chip carrier package electrically engage said protruding contacts of said fingers when the carrier package is advanced into the test position in said inlet so that the pads of the package may be accessed by the test apparatus connected to said lower contact portion of said fingers.

6. The test fixture of claim 5 wherein
    said head includes a plurality of arms arranged in a cross-like configuration;
    said base includes a cylindrical aperture with inwardly projecting tabs, and cross-like recesses aligned and dimensioned for seating engagement with said arms of said head when said plunger is depressed; and
    said piston is dimensioned and configured for reciprocating communication within said aperture of said base.

7. The test fixture of claim 6 wherein said piston further comprises slots extending lengthwise thereof and terminating in motion stops to limit the motion of said piston.

8. The test fixture of claim 7 wherein
each of said arms includes a circular recess formed thereunder; and
each of said cross-like recesses further includes a circular recess aligned to a respective recess of said arm to accommodate a spring, wherein said springs collectively position said head in an upwardly biased position.

9. The test fixture of claim 8 wherein each arm of said head terminates upwardly for receiving and holding the carrier package when it is advanced into the test position.

10. A test fixture configured for installation within a contactor used to facilitate the connection of conductor pads of an integrated circuit chip carrier package to test apparatus, said test fixture comprising:
a spring-loaded plunger assembly for receiving the carrier package and advancing the carrier package into a test position when said plunger is depressed. said plunger comprising:
a head including a plurality of arms arranged in a cross-like configuration;
a base with a groove around the perimeter thereof and including a cylindrical aperture with inwardly projecting tabs, said base further including cross-like recesses aligned and dimensioned for seating engagement with said arms of said head when said plunger is depressed; and
a piston coupled to said head, said piston dimensioned and configured for reciprocating communication within said aperture of said base; and
a plurality of contact members mounted to said plunger and providing contact with the conductor pads of the carrier package, each of said contact members comprising:
a tongue dimensioned for frictionally engaging said groove of said base;
a pair of detent projections and a pair of notches, said detent projections dimensioned and arranged for mating with notches of adjacent ones of said contact members; and
a plurality of contact fingers configured for electrical engagement with the conductor pads of the carrier, each of said contact fingers including an upper portion having a protruding contact facing an inlet defined by said test fixture and a lower contact portion,
whereby the conductor pads of the chip carrier package electrically engage said protruding contacts of said fingers when the carrier package is advanced into the test position in said inlet so that the pads of the package may be accessed by the test apparatus connected to said lower contact portion of said fingers.

11. The test fixture of claim 10 wherein said piston further comprises slots extending lengthwise thereof and terminating in motion stops to limit the motion of said piston.

12. The test fixture of claim 11 wherein
each of said arms includes a circular recess formed thereunder; and
each of said cross-like recesses further includes a circular recess aligned to a respective recess of said arm to accommodate a spring, wherein said springs collectively position said head in an upwardly biased position.

13. The test fixture of claim 12 wherein each arm of said head terminates upwardly for receiving and holding the carrier package when it is advanced into the test position.

14. The test fixture of claim 13 wherein said base further comprises a pair of upwardly projecting guiding pins for engaging locating holes in the carrier package, said guiding pins enabling the carrier package to be correctly seated onto said plunger.

15. A contactor for facilitating the connection of conductor pads of an integrated circuit chip carrier package to test apparatus, the test apparatus including ram means for supporting the carrier package and for advancing it into a test position in registration with said contactor at the beginning of a test and for retracting the carrier package from said contactor at the conclusion of the test, said contactor comprising:
a test fixture for receiving the carrier package and for providing contact with electrical conductor pads of the carrier package, said test fixure including a plurality of contact members and a spring-loaded plunger assembly having a base portion with a groove around the perimeter thereof, each of said contact members comprising:
a tongue dimensioned for engaging said groove of said plunger;
a pair of detent projections and a pair of notches, said detent projections dimensioned and arranged for mating with notches of adjacent ones of said contact members; and
a plurality of contact fingers configured for electrical engagement with the conductor pads of the carrier, each of said contact fingers including an upper portion having a protruding contact facing an inlet defined by said test fixture and a lower portion having a sloped contact;
a housing unit with a cavity configured and dimensioned for encompassing said test fixture when installed therein, said housing unit further including a central aperture with a lip extending from the periphery thereof for biasing said upper portions of said contact fingers inwardly; and
a contact base coupled to said housing unit, said base including a plurality of conductive portions configured and arranged for frictional engagement with said lower portions of said contact fingers, said conductive portions being connected to respective test points of said base via conductive traces,
whereby the conductor pads of the integrated circuit chip carrier package electrically engage said protruding contacts of said fingers when the carrier package is advanced into the test position in said inlet so that the pads of the package may be accessed by the test apparatus connected to said test points.

16. The contactor of claim 15 wherein
said housing unit further comprises a rim around the periphery of said cavity; and
each of said contact members further includes an outer ridge arranged for seating engagement with said rim.

17. The contactor of claim 16 wherein each of said lower portions of said contact fingers extends in a downwardly direction from said contact member.

18. The contactor of claim 17 further comprising a retainer plate for restricting the movement of said test fixture within said housing unit and for providing spacing to offset the height of said lower portions of said fingers extending from said contact members, said retainer plate having an opening with a periphery dimensioned to overlap said outer ridges of said members.

19. The contactor of claim 18 wherein
said lip of said housing unit is a curved lip projecting into said inlet of said test fixture; and
said curved lip extends downwardly from sidewalls around said central aperture, said sidewalls guiding the carrier package into said inlet.

20. The contactor of claim 19 further comprising a jig for installing said test fixture within said housing unit.

21. A contactor for facilitating the connection of electrical conductor pads of an integrated circuit chip carrier package to test apparatus, the test apparatus including ram means for supporting the carrier package and for advancing it into a test position in registration with said contactor at the beginning of a test and for retracting the carrier package from said contactor at the conclusion of the test, said contactor comprising:
  a test fixture for receiving the carrier package and for providing contact with the electrical conductor pads of the carrier package, said test fixture comprising:
  A. a spring-loaded plunger assembly for receiving the carrier package and advancing the carrier package into a test position when said plunger is depressed, said plunger assembly comprising:
    a head including a plurality of arms arranged in a cross-like configuration;
    a base with a groove around the perimeter thereof and including a cylindrical aperture with inwardly projecting tabs, said base further including cross-like recesses aligned and dimensioned for seating engagement with said arms of said head when said plunger is depressed; and
    a piston coupled to said head, said piston dimensioned and configured for reciprocating communication within said aperture of said base; and
  B. a plurality of contact members mounted to said plunger and providing contact with the electrical conductor pads of the carrier package, each of said contact members comprising:
    an outer ridge;
    a tongue dimensioned for engaging said groove of said base;
    a pair of detent projections and a pair of notches, said detent projections dimensioned and arranged for mating with notches of adjacent ones of said contact members; and
    a plurality of contact fingers configured for electrical engagement with the conductor pads of the carrier, each of said contact fingers including an upper portion having a protruding contact facing an inlet defined by said test fixture and a lower portion having a sloped contact;
  a housing unit with a cavity configured and dimensioned for encompassing said test fixture when installed therein, said housing unit comprising:
    a rim around the periphery of said cavity, said rim arranged for seating engagement with said outer ridges of said contact members; and
    a central aperture with a lip extending from the periphery thereof for biasing said upper portions of said contact fingers inwardly;
  a retainer plate for restricting the movement of said test fixture within said housing unit and for providing spacing to offset the height of said lower portions of said fingers extending from said contact members, said retainer plate having an opening with a periphery dimensioned to overlap said outer ridges of said members; and
  a contact base coupled to said housing unit, said base including a plurality of conductive portions configured and arranged for frictional engagement with said lower portions of said contact fingers, said conductive portions being connected to respective test points of said base via conductive traces,
  whereby the conductor pads of the integrated circuit chip carrier package electrically engage said protruding contacts of said fingers when the carrier package is advanced into the test position in said inlet so that the pads of the package may be accessed by the test apparatus connected to said test points.

22. The contactor of claim 21 wherein said piston further comprises slots extending lengthwise thereof, said slots coacting with said inwardly projecting tabs to maintain an angular orientation of said piston and said head.

23. The contactor of claim 22 wherein
each of said arms includes a circular recess formed thereunder; and
each of said cross-like recesses further includes a circular recess aligned to a respective recess of said arm to accommodate a spring, wherein said springs collectively position said head in an upwardly biased position.

24. The contactor of claim 23 wherein each arm of said head terminates upwardly for receiving and holding the carrier package when it is advanced into the test position.

* * * * *